United States Patent
Sato (10) Patent No.: US 7,864,308 B2
(45) Date of Patent: Jan. 4, 2011

(54) POSITION DETECTION METHOD, EXPOSURE APPARATUS, AND DEVICE MANUFACTURING METHOD

(75) Inventor: Hiroshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/368,790

(22) Filed: Feb. 10, 2009

(65) Prior Publication Data
US 2009/0201514 A1 Aug. 13, 2009

(30) Foreign Application Priority Data
Feb. 12, 2008 (JP) .............................. 2008-031029

(51) Int. Cl.
*G01J 1/00* (2006.01)
(52) U.S. Cl. ........................... 356/123; 355/53; 355/55; 355/69; 355/71; 356/401; 356/624
(58) Field of Classification Search ................... 355/53, 355/55, 67–69, 71, 77; 356/624, 121–124, 356/399–401
See application file for complete search history.

(56) References Cited

U.S. PATENT DOCUMENTS

| 5,969,820 A | * | 10/1999 | Yoshii et al. | ................. 356/623 |
| 6,335,784 B2 | * | 1/2002 | Mishima | ....................... 355/53 |
| 7,130,021 B2 | | 10/2006 | Kobayashi | |
| 2008/0160425 A1 | * | 7/2008 | Hong | .......................... 382/144 |

FOREIGN PATENT DOCUMENTS

JP 2005-302825 A 10/2005

* cited by examiner

*Primary Examiner*—Gregory J Toatley
*Assistant Examiner*—Iyabo S Alli
(74) *Attorney, Agent, or Firm*—Canon U.S.A., Inc. I.P. Division (57) ABSTRACT

This invention discloses a position detection method for detecting the focus position of an optical position detection apparatus including an image sensor and an optical system which forms an image of a target object on the image sensing surface of the image sensor. In this method, the relationship between the position of the target object in the optical-axis direction of the optical system and the evaluation value of the signal output from the image sensor is measured, and the position of a peak close to a reference focus position, which is selected if the evaluation value has a plurality of peaks in the measured relationship, is detected as the focus position.

9 Claims, 9 Drawing Sheets

IN-PLANE VARIATION OF WAFER

CONTRAST CURVE A1 OBTAINED
BY ADDING CONTRAST CURVES
IN RESPECTIVE SHOTS

FIG. 9
PRIOR ART

POSITION DETECTION METHOD, EXPOSURE APPARATUS, AND DEVICE MANUFACTURING METHOD

BACKGROUND OF THE INVENTION

1. Field of the Invention

The present invention relates to a position detection method, an exposure apparatus, and a device manufacturing method.

2. Description of the Related Art

A projection exposure apparatus such as a stepper and a scan type projection exposure apparatus such as that of the step & scan scheme have been known as exposure apparatuses used to manufacture, for example, a semiconductor device, a liquid crystal display device, and a thin film magnetic head by lithography (Japanese Patent Laid-Open No. 2005-302825).

Figure 1:
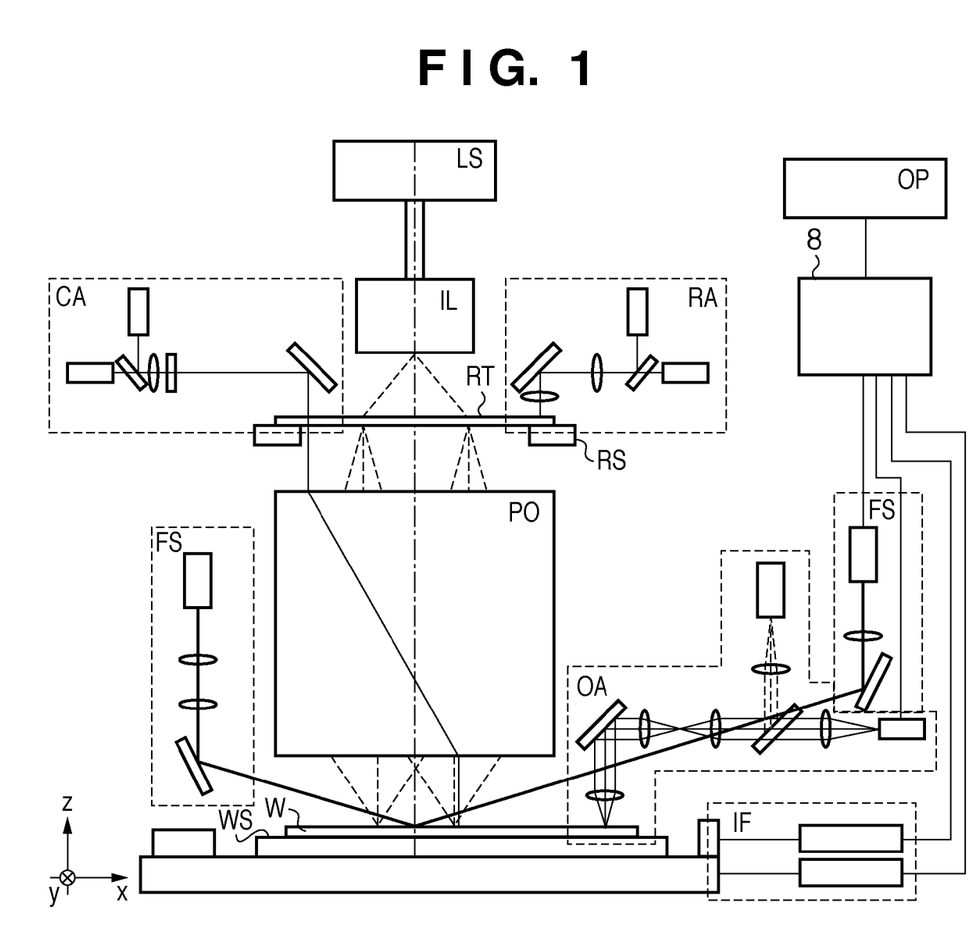
FIG. 1 is a block diagram showing an example of the schematic overview of an exposure apparatus.

An exposure apparatus will be simply explained with reference to FIG. 1 herein.

A single-wavelength oscillation laser beam such as a KrF excimer laser beam or an ArF excimer laser beam having a shorter wavelength than it as extreme ultraviolet light is used for an exposure light source LS. A light beam emitted by the exposure light source LS illuminates a predetermined region on a reticle RT serving as a pattern original via an illumination optical system IL. A pattern to be transferred is formed on the reticle RT. The pattern (for example, a microcircuit pattern) formed on the reticle RT is projected onto a wafer W by a projection optical system PO.

The exposure apparatus is required to have a resolving power close to a theoretical limit. To meet this need, the exposure apparatus includes a mechanism which measures factors (for example, the atmospheric pressure and ambient temperature) that influence the resolving power, and corrects the imaging characteristics of the projection optical system PO in accordance with the measurement result. The numerical aperture of the projection optical system PO is set large in order to attain a high resolving power, so the depth of focus is considerably small. A focus position detection system FS of the oblique-incidence detection scheme (to be referred to as a focus detection system hereinafter) measures the three-dimensional shape of the entire surface of the wafer W, and adjusts the level, which is optimum for exposure, of the projection optical system PO in the optical-axis direction (to be referred to as the z direction hereinafter).

Along with an improvement in the resolving power, higher overlay accuracy is also required. An offaxis alignment detection system OA (to be referred to as an alignment detection system hereinafter) set outside the optical axis of the projection optical system PO is used for overlay. The alignment detection system OA observes a plurality of alignment marks formed on the wafer W, and calculates and corrects the amount of misalignment in a shot region on a plane (to be referred to as the x-y plane hereinafter) perpendicular to the optical axis of the projection optical system PO.

The optical axis of the projection optical system PO which actually performs exposure and that of the alignment detection system OA have a distance called the base line amount between them. When the base line amount changes, an error occurs as the marks are moved under the projection optical system PO after measurement by the alignment detection system OA. To attain stable alignment with a higher accuracy, an optical position detection system CA of the TTL-AA (Through The Lens Auto Alignment) scheme measures and corrects the change in the base line amount. The optical position detection system CA of the TTL-AA scheme measures the relative position between the reticle RT and the wafer W using, for example, exposure light having propagated through the reticle RT and projection optical system PO. Light emitted by a light source in the optical position detection system CA illuminates an alignment mark (not shown) formed on the reticle RT. The light reflected and scattered by this mark forms an image on the image sensing surface of an image sensor in the optical position detection system CA. Detection light transmitted through a transparent region other than the alignment mark on the reticle RT reaches an alignment mark and stage reference mark on the wafer W via the projection optical system PO. The light reflected and scattered by these marks forms an image on the image sensing surface of the image sensor in the optical position detection system CA upon being transmitted through the transparent region other than the alignment mark on the reticle RT via the projection optical system PO. The alignment mark on the reticle RT and the alignment mark and stage reference mark on the wafer W can be observed simultaneously. This makes it possible to measure the relative positional relationship (in the x and y directions perpendicular to the optical axis of the projection optical system PO) between the reticle RT and the wafer W, and the conjugate relationship (focusing) between the reticle RT and the wafer W.

A reticle alignment optical system RA serves to detect whether the relative position between a reticle stage RS and the reticle RT is aligned. The reticle alignment optical system RA observes a reticle reference mark formed on the reticle stage RS and the alignment mark formed on the reticle RT in the same field, thereby measuring their relative position and aligning the reticle RT.

Optical position detection systems such as the alignment detection system OA and the optical position detection system CA of the TTL-AA scheme must adjust the focus (the position in the optical-axis direction) of the alignment mark with respect to the detection systems before measuring the position of the alignment mark. For this reason, the signal output from the image sensor, which is based on the irradiation of the mark to be detected, is monitored while driving the mark in the optical-axis direction. An optimum focus position is then detected based on evaluation values such as the driving position and the contrast of the output signal, thereby detecting the position of the alignment mark at the detected optimum focus position. For example, one known method acquires a contrast curve describing the relationship between the driving position and the contrast of the output signal, and determines the peak position of the contrast curve, at which the contrast is maximum, as the focus position.

However, depending on the illumination condition of the optical position detection system, the contrast curve often has not a single peak but a plurality of peaks. The states of individual marks vary due to manufacturing errors, for example, between shots on a wafer, between wafers, and between lots, so a peak position serving as a reference of the focus position is unstable when the contrast curve has a plurality of peaks. In this case, the detected focus position changes depending on the process state, and it also largely changes between shots and between wafers.

Figure 9:
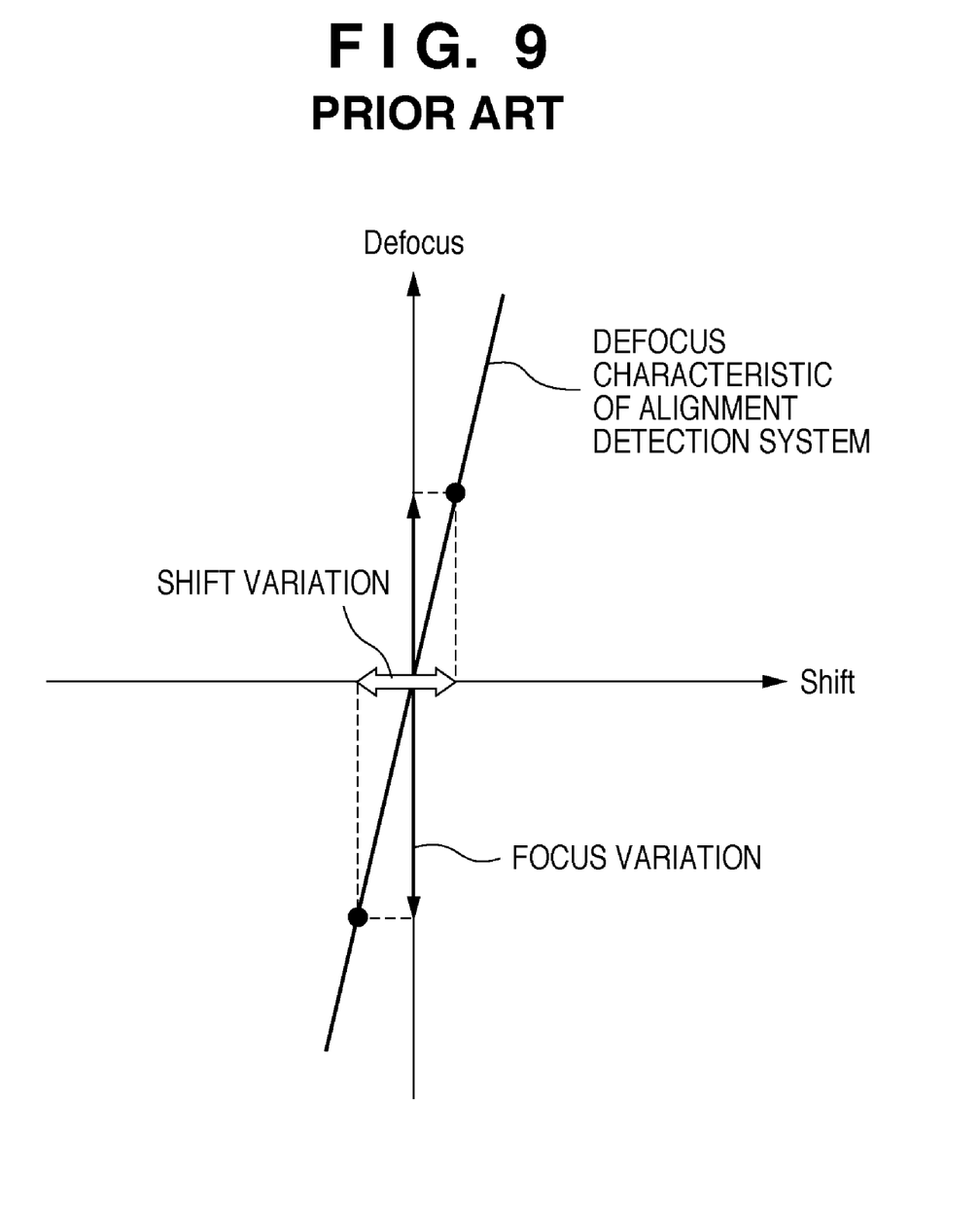
FIG. 9 is a graph showing the conventional problem.

As shown in FIG. 9, a defocus characteristic may remain in the alignment detection system OA as an optical system assembly and adjustment error. This characteristic represents a shift in the position (in the in-plane direction on the wafer surface) of the detected mark, which depends on the focus position. Therefore, along with a large variation in the focus position in alignment, the measurement value of the alignment mark varies due to the defocus characteristic, which has a large adverse influence on the alignment accuracy.

SUMMARY OF THE INVENTION

The present invention enables to provide a technique of suppressing a variation in the focus position even when a plurality of peaks is detected in the evaluation value of the signal output from an image sensor.

According to a first aspect of the present invention, there is provided a position detection method for detecting a focus position of an optical position detection apparatus including an image sensor and an optical system which forms an image of a target object on an image sensing surface of the image sensor, the method comprising measuring a relationship between a position of the target object in an optical-axis direction of the optical system and an evaluation value of the signal output from the image sensor; and detecting, as the focus position, a position of a peak close to a reference focus position, which is selected if the evaluation value has a plurality of peaks in the relationship measured in the measuring.

According to a second aspect of the present invention, there is provided an exposure apparatus which projects a pattern of an original onto a substrate held by a stage, thereby exposing the substrate to light, the apparatus comprising an optical position detection unit which includes an image sensor and an optical system configured to form an image of a target object on an image sensing surface of the image sensor; a stage driving mechanism configured to drive the stage; and a control unit configured to control the optical position detection unit and the stage driving mechanism, wherein the control unit measures a relationship between a position of the target object in an optical-axis direction of the optical system and an evaluation value of the signal output from the image sensor, detects, as the focus position, a position of a peak close to a reference focus position, which is selected if the evaluation value has a plurality of peaks in the measured relationship, and aligns the stage by detecting the position of the target object at the focus position detected by the optical position detection unit and controlling the stage driving mechanism based on the position of the target object.

According to a third aspect of the present invention, there is provided a device manufacturing method comprising exposing a substrate to light by an exposure apparatus; and developing the substrate, wherein the exposure apparatus includes an optical position detection unit which includes an image sensor and an optical system configured to form an image of a target object on an image sensing surface of the image sensor, a stage driving mechanism configured to drive the stage, and a control unit configured to control the optical position detection unit and the stage driving mechanism, and the control unit measures a relationship between a position of the target object in an optical-axis direction of the optical system and an evaluation value of the signal output from the image sensor, detects, as the focus position, a position of a peak close to a reference focus position, which is selected if the evaluation value has a plurality of peaks in the measured relationship, and aligns the stage by detecting the position of the target object at the focus position detected by the optical position detection unit and controlling the stage driving mechanism based on the position of the target object.

Further features of the present invention will become apparent from the following description of exemplary embodiments with reference to the attached drawings.

DESCRIPTION OF THE EMBODIMENTS

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

This embodiment will exemplify a case in which an exposure apparatus to which a position detection method according to the present invention is applied (as, for example, as an optical position detection unit or optical position detection apparatus) detects the focus position in an alignment detection system OA.

The schematic overview of an exposure apparatus will be explained with reference to FIG. 1. Note that a description of the same points as above will not be given.

The alignment detection system OA optically detects an alignment mark (target object) on a wafer W held by a wafer stage WS. The alignment detection system OA performs wafer alignment without a projection optical system PO, so it has a small number of optical limitations. For this reason, detection in this case is expected to be performed with higher accuracy than that when detection is performed via the projection optical system PO at a high probability.

An interferometer IF which detects the position of the wafer stage measures the position of the wafer stage WS on the x-y plane. Based on the position measurement, the wafer stage WS is driven so that the alignment mark (not shown in FIG. 1) on the wafer W is moved into the detection range of the alignment detection system OA, thereby measuring the position of the alignment mark.

The alignment detection system OA shown in FIG. 1 will be described in more detail with reference to FIG. 2.

Figure 2:
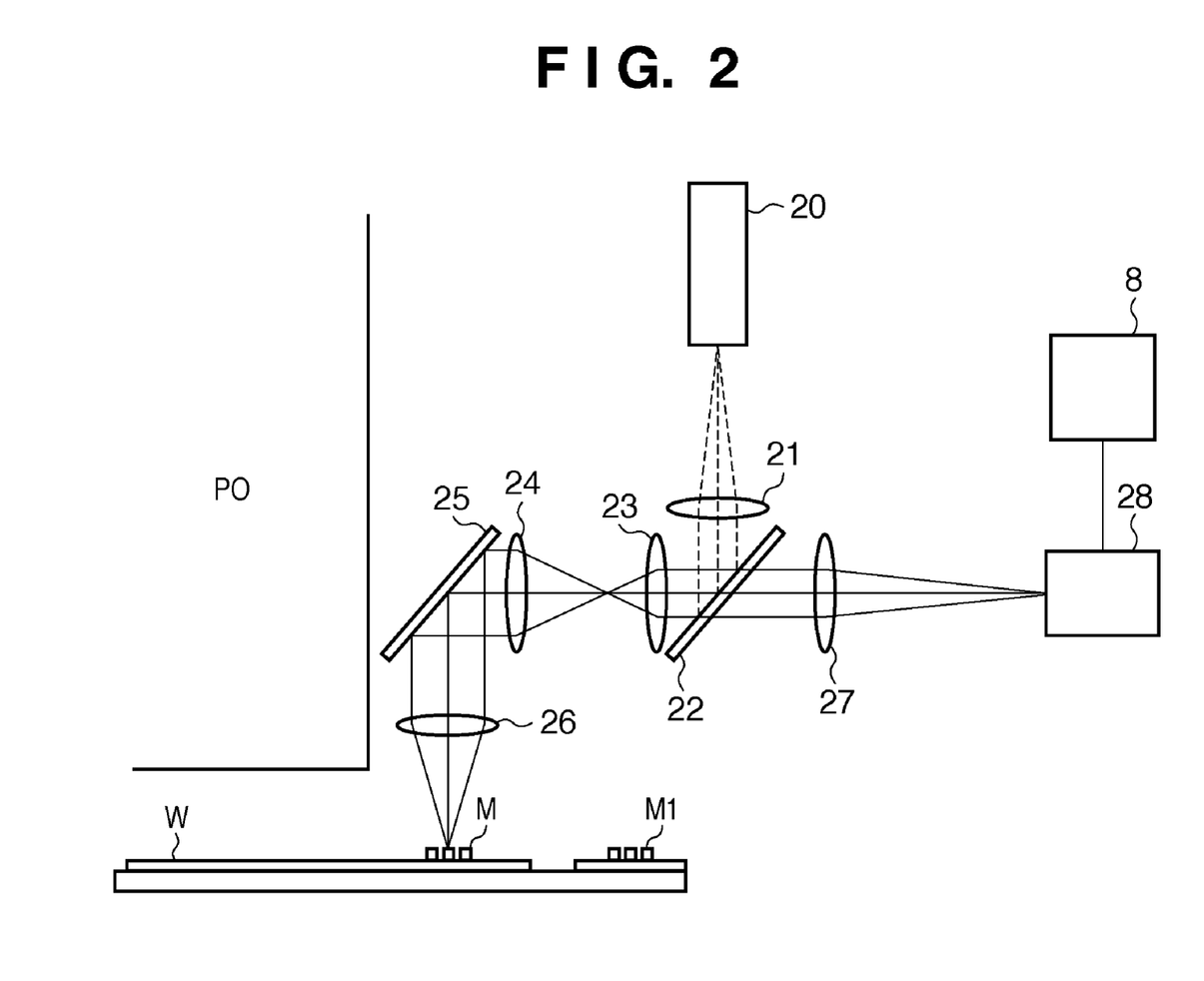
FIG. 2 is a view showing an example of the schematic overview of an alignment detection system OA shown in FIG. 1.

The alignment detection system OA includes optical systems such as an illumination light source 20 and objective lens 26 for the alignment detection system, as shown in FIG. 2. The illumination light source 20 supplies light with a wide wavelength range using a halogen lamp or monochromatic light using an He—Ne laser.

Illumination light emitted by the illumination light source 20 is reflected by a half mirror 22 via an illumination system lens 21, and enters a front imaging lens group 23. The illumination light is further reflected by a reflecting mirror 25 via a relay lens 24, and enters the objective lens 26. The illumination light converged by the objective lens 26 illuminates an alignment mark M formed on the wafer W aligned to fall within the observation possible range.

The light reflected and scattered by the alignment mark M is reflected by the reflecting mirror 25 via the objective lens 26, and enters the relay lens 24. The light reflected and scattered by the relay lens 24 is transmitted through the half mirror 22 via the front imaging lens group 23, is converged by a rear imaging lens group 27, and forms an image of the alignment mark M on the image sensing surface of an image sensor 28 such as a CCD (charge Coupled Device). The image sensor 28 sends the output signal which bears the information of the image of the alignment mark M formed on the image sensing surface to a control unit 8. The control unit 8 processes the signal, thereby detecting the position of the alignment mark M on the wafer W. In addition, based on the information from the interferometer IF mentioned above, the array information of shot regions formed on the wafer W is acquired. The wafer stage WS is driven by a stage driving mechanism (not shown) based on the array information of the shot regions to move the wafer W into the exposure region of the projection optical system PO. The exposure apparatus performs exposure step by step in this way.

The focus position of the alignment mark M in the alignment detection system OA is obtained by measurement. The alignment detection system OA drives the wafer stage WS in the optical-axis direction, that is, the z direction while observing the mark on the wafer W. The position at which an optimum evaluation value of the signal output from the image sensor 28 is measured is determined as the focus position.

A detailed measurement method will be described below.

The alignment detection system OA measures the alignment mark M in a plurality of shots in order to measure the array information of the shot regions on the wafer W. To accurately measure the array information of the shot regions, it is necessary to calculate an optimum focus position for each alignment mark M. An optimum focus position in the alignment detection system OA of the image sensing scheme includes, for example, the position at which the contrast is a maximum. This is because the higher the contrast, the relatively smaller the influence of random noise components typified by electrical noise becomes, and the measurement reproducibility is expected to improve accordingly.

Figure 3A:
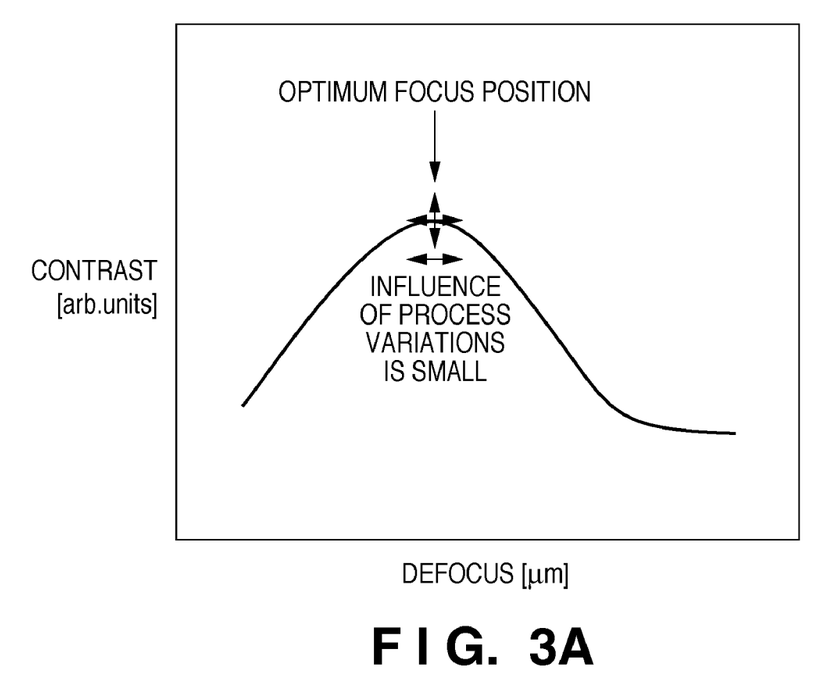
FIGS. 3A and 3B are graphs showing an example of contrast curves.

To attain this operation, first, the alignment mark M to be measured is brought into the field of the alignment detection system OA, and the wafer W is driven in the optical-axis direction of the alignment detection system OA (to be referred to as the z direction hereinafter) while measuring the signal output from the image sensor 28. With this operation, the driving amount in the z direction and the contrast of the output signal can be obtained to plot a convex graph (contrast curve) (FIG. 3A). This allows alignment with high measurement accuracy by alignment measurement using the peak (the position at which the contrast is maximum) of this contrast curve as the focus position.

Figure 3B:
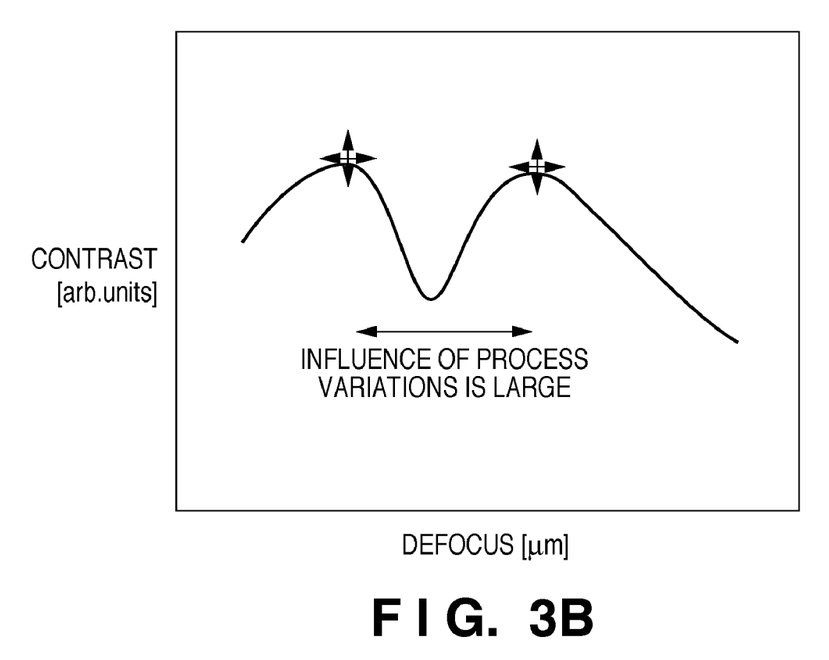

In this manner, if the contrast curve has a single peak, the peak position and contrast value change only slightly even when there is a process variation. This allows stable focus measurement with little influence on the overlay accuracy. However, if a plurality of peaks is detected in the contrast curve, the focus position changes largely when there is a process variation. For example, FIG. 3B shows a contrast curve output upon measuring the alignment mark M by decreasing the illumination σ of the alignment detection system OA. Referring to FIG. 3B, the contrast curve has two peaks with respect to the driving amount in the z direction. In this case, the contrast changes due to process variations, so the maximum peak shifts between these two peaks. For this reason, a peak to be identified as the focus position changes due to process variations for each shot or each wafer, resulting a variation in the focus position in alignment.

A defocus characteristic representing a shift in the position of the detected mark, which depends on the focus position, may remain in the alignment detection system OA as an optical system assembly and adjustment error. Therefore, along with a variation in the focus position in alignment, the measurement value of the mark varies, which has a large adverse influence on the alignment accuracy.

Considering this variation, measurement need only be performed under an illumination condition and detection condition under which the contrast curve has a single peak. However, the contrast of the signal output from the image sensor 28 is often low depending on the process. In this case, it is impossible to perform observation with high accuracy unless measures are taken to decrease the illumination σ and increase the contrast. Nevertheless, decreasing the illumination σ is likely to generate a plurality of peaks.

To cope with this situation, a method of detecting a stable focus position even when a plurality of peaks is generated in the relationship (contrast curve) between the defocus of the wafer W and the contrast of the output signal based on the illumination of the alignment mark M will be explained in the following embodiments.

First Embodiment

A focus position detection method according to the first embodiment will be explained first. The first embodiment will exemplify a case in which, if a plurality of peaks is generated in the above-mentioned contrast curve, a peak close to a reference focus position is selected from the plurality of peaks, and the position of the selected peak is detected as the focus position. Note that the focus position (peak) in a reference illumination mode is used as the reference focus position in the first embodiment. The focus position in the reference illumination mode means the focus position detected under an illumination condition under which the contrast curve has a single peak (for example, the illumination σ is large). The contrast curve in the reference illumination mode is, for example, the one indicated by the broken line in FIG. 5A.

Figure 4:
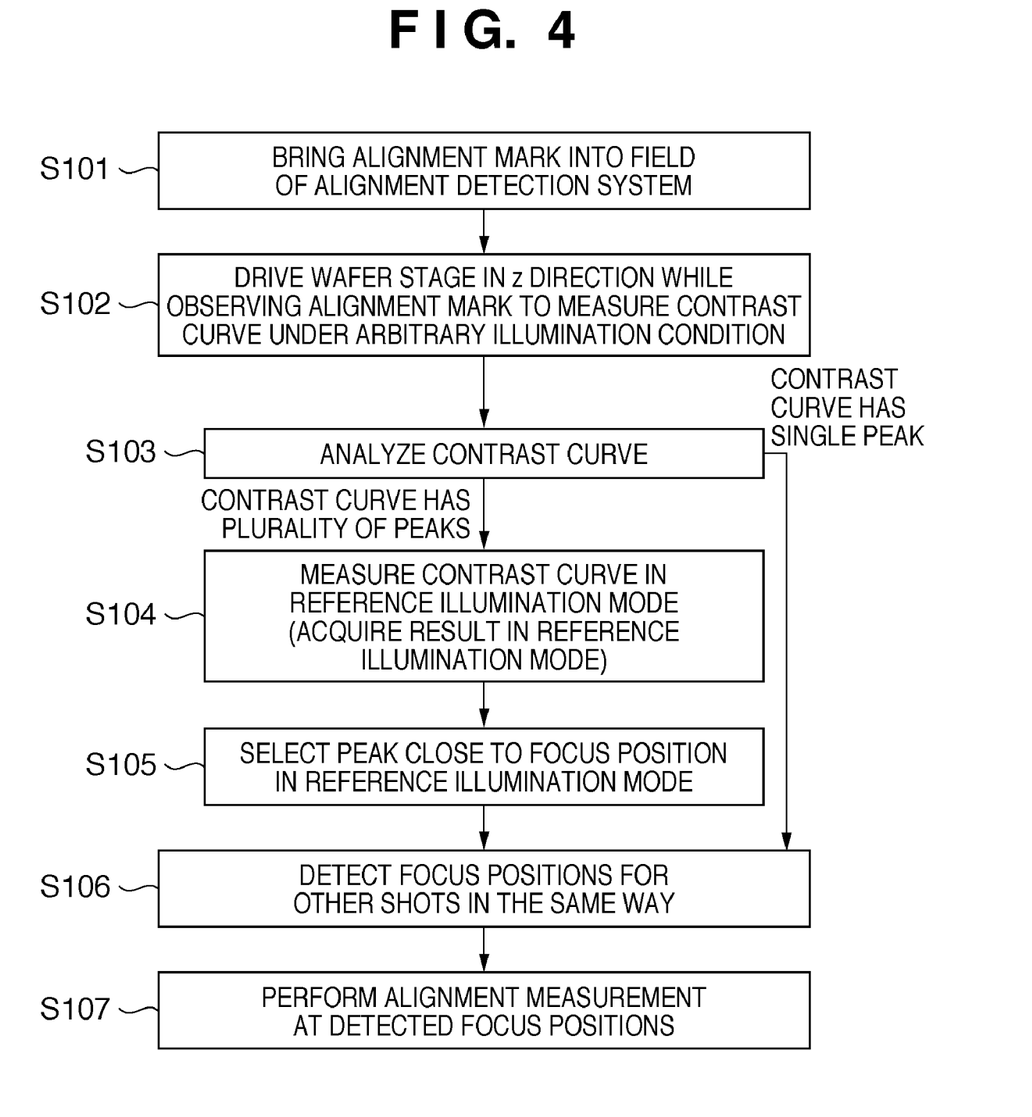
FIG. 4 is a flowchart illustrating an example of the sequence of a focus position detection method according to the first embodiment.

An example of the sequence of the focus position detection method according to the first embodiment will be explained with reference to FIG. 4 herein.

A control unit 8 controls a stage driving mechanism (not shown) to drive a wafer stage WS so that an alignment mark M on a wafer W falls within the field of an alignment detection system OA (step S101).

The control unit 8 controls the stage driving mechanism to drive the wafer stage WS in the z direction while observing the alignment mark M under the alignment illumination condition (in this case, a condition under which the illumination σ is small). With this operation, the relationship (contrast curve) between the driving amount of the wafer W in the z direction and the contrast of the signal output from the image sensor 28 is measured (step S102). The contrast curve measured in step S102 is, for example, the one indicated by the solid line in FIG. 5A.

Figure 5A:
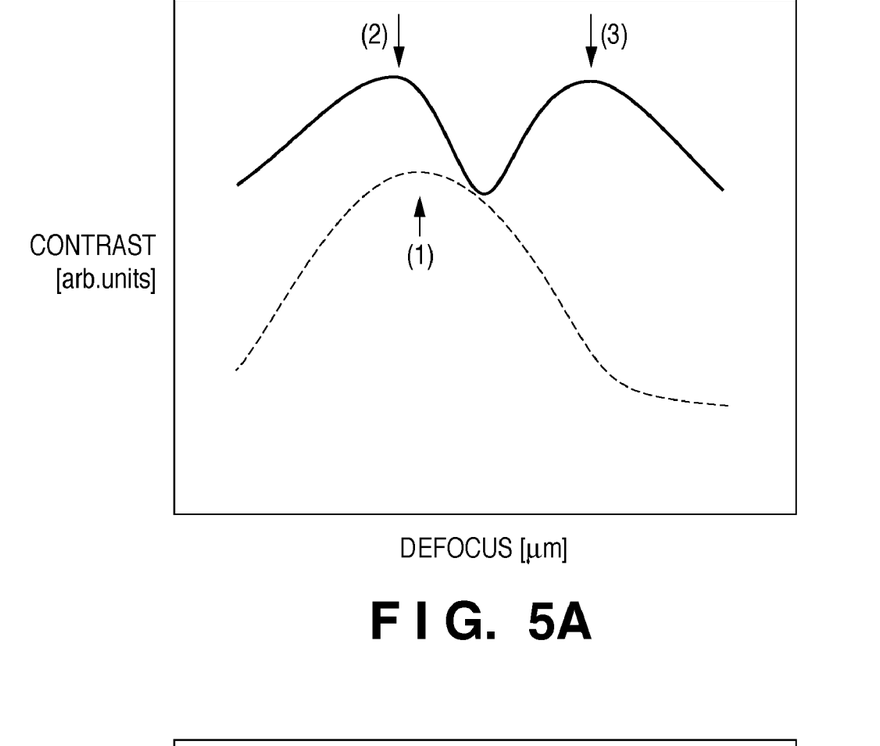
FIGS. 5A and 5B are graphs showing an example of contrast curves.
Figure 5B:
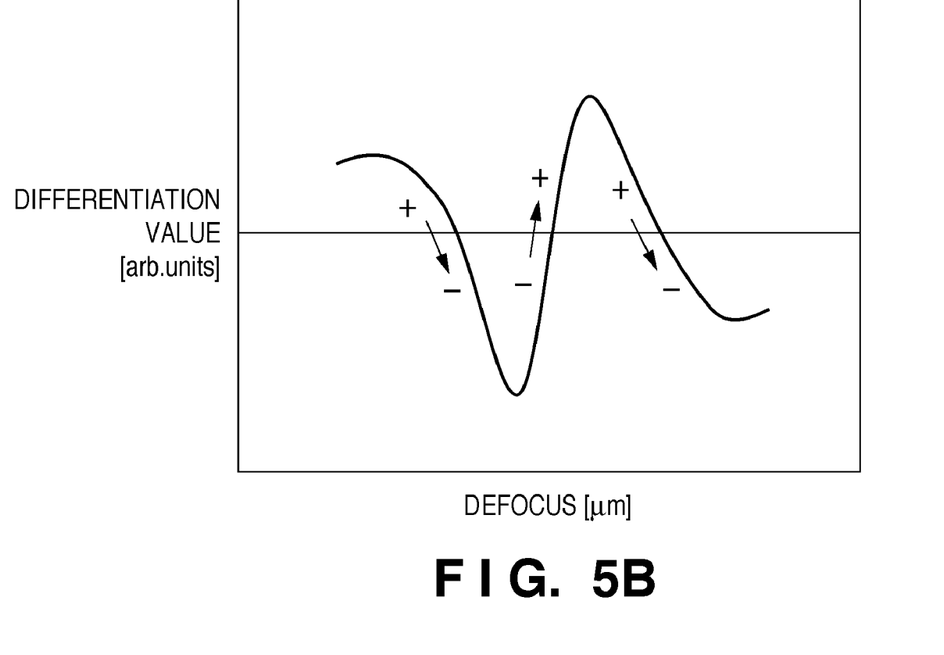

The control unit 8 analyzes the measured contrast curve to check the number of peaks serving as the focus positions (step S103). FIG. 5B shows the result (differential curve) obtained by calculating the derivative of each point on the contrast curve indicated by the solid line in FIG. 5A as a gradient with respect to the focus position. Referring to FIG. 5B, portions which cross over the abscissa which runs along the middle line of the graph and indicates zero are inflexion points. Note that, because portions at which the contrast is high must be detected in this embodiment, portions in which the derivative values change from positive values to negative values and which cross over the abscissa indicating zero are detected. In the example shown in FIG. 5B, two points correspond to these portions. Accordingly, the contrast curve indicated by the solid line in FIG. 5A is determined as a contrast curve having a plurality of peaks. In another method, the number of peaks may be obtained by performing polynomial fitting for the contrast curve and differentiating the polynomial to derive a differential curve. Note that a polynomial having an order (for example, the 10th order or 15th order) large enough for a possible contrast curve is fit. The number of peaks is obtained by differentiating the obtained polynomial and calculating the number of peaks within the measured focus range.

If a single peak is detected as a result of the analysis in step S103, alignment need only be performed at a focus position which exhibits that peak. If a plurality of peaks is detected, one peak is selected from the plurality of peaks based on the reference focus position to always determine a peak around a specific position as the focus position. The reason why a peak around a specific position is always determined as the focus position is to suppress a focus variation.

If a plurality of peaks is detected, the control unit 8 illuminates the alignment mark M in the reference illumination mode, and measures the contrast curve based on its illumination (step S104). The measurement of the contrast curve of the alignment mark M in the reference illumination mode need not always be done at this timing, and, for example, may be done in advance. In this case, in step S104, the contrast curve in the reference illumination mode recorded in advance is read out from a storage device (for example, a RAM). The contrast curve in the reference illumination mode is, for example, the one indicated by the broken line in FIG. 5A.

The control unit 8 specifies the peak position and detects the focus position (step S105). The focus position is detected by selecting a peak close to the focus position (peak) in the reference illumination mode from the contrast curve obtained in step S102. Note that the above-mentioned differential curve calculation processing and the like must be performed for the contrast curve measured in the reference illumination mode to confirm that this contrast curve has a single peak.

When it is confirmed that the contrast curve has a single peak in the reference illumination mode, a focus position (1) which exhibits that peak is compared with a contrast curve having a plurality of peaks. A peak position (2) close to the peak position (1) in the reference illumination mode is detected as the focus position under the illumination condition in this mode.

Every time focus measurement is performed in each shot (which requires focus measurement), a peak close to the peak position (1) in the reference illumination mode is detected as the focus position (step S106). Alignment measurement is performed in respective shots at these detected focus positions (step S107).

As described above, according to the first embodiment, it is possible to detect a stable focus position even when there is a process variation between shots, between wafers, or between lots. This allows alignment measurement with high accuracy.

Second Embodiment

A focus position detection method according to the second embodiment will be explained next. As in the first embodiment, the second embodiment will exemplify a case in which a peak close to a reference focus position is selected from a plurality of peaks, thereby detecting the focus position. The difference from the first embodiment lies in that the focus position for an immediately preceding shot or wafer is adopted as the reference focus position in the second embodiment. That is, if the contrast curve has a plurality of peaks and therefore it is difficult to stably determine the focus position due to process variations, the position of a peak close to the focus position for a preceding shot or wafer is determined as the focus position of the alignment mark.

Figure 6:
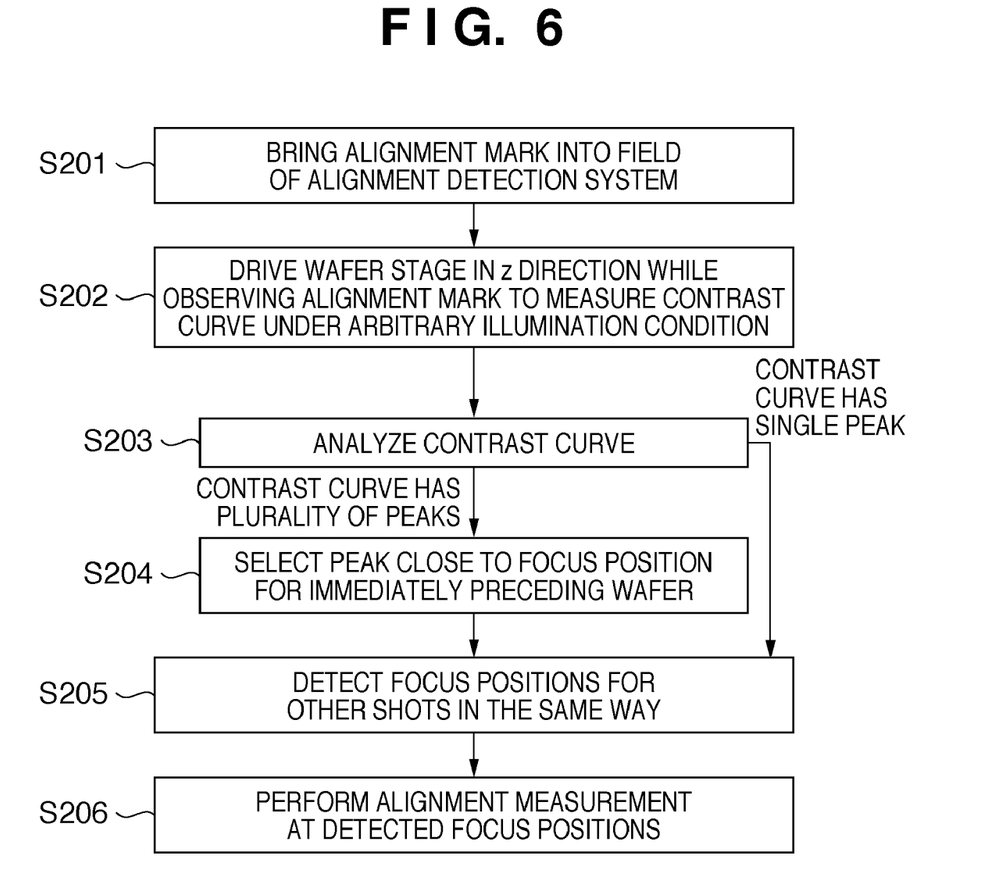
FIG. 6 is a flowchart illustrating an example of the sequence of a focus position detection method according to the second embodiment.

An example of the sequence of the focus position detection method according to the second embodiment will be explained with reference to FIG. 6 herein. Note that processes from steps S201 to S203 are the same as those in steps S101 to S103 in FIG. 4 that have explained the first embodiment, and a description thereof will not be given.

In step S203, if the contrast curve is determined to have a plurality of peaks, a control unit 8 reads out focus position information used for an immediately preceding shot or wafer from a storage device (for example, a RAM). A peak close to this position is detected as the focus position (step S204). The same selection is performed in succeeding focus measurement as well (step S205), and alignment measurement is performed in each shot at these measured focus positions (step S206).

As described above, according to the second embodiment, it is possible to detect a stable focus position even when there is a process variation between shots, between wafers, or between lots. This allows alignment measurement with high accuracy.

The second embodiment has exemplified a case in which the focus position for an immediately preceding shot or a shot on an immediately preceding wafer is determined as the reference focus position. This is because an error of the focus position is less likely to occur as compared with a case in which the focus position for a more preceding shot or wafer is used. However, an immediately preceding shot or wafer need not always be used, and the focus position for a more preceding shot or wafer (for example, the focus position for the second preceding wafer) may be determined as the reference focus position.

Third Embodiment

A focus position detection method according to the third embodiment will be explained next. As in the first embodiment, the third embodiment will exemplify a case in which a peak close to a reference focus position is selected from a plurality of peaks, thereby detecting the focus position. The difference from the first embodiment lies in that the peak position of a contrast curve derived by adding the contrast curves in a plurality of measurement shots on the surface of a wafer W and averaging them is adopted as the reference focus position in the third embodiment.

The overview of the focus position detection method according to the third embodiment will be explained with reference to FIG. 7 herein.

To obtain an optimum focus position for an alignment detection system OA, a control unit 8 measures the contrast curve under an arbitrary illumination condition, and obtains the number of peaks of this curve, in the same way as described in the first embodiment.

Figure 7:
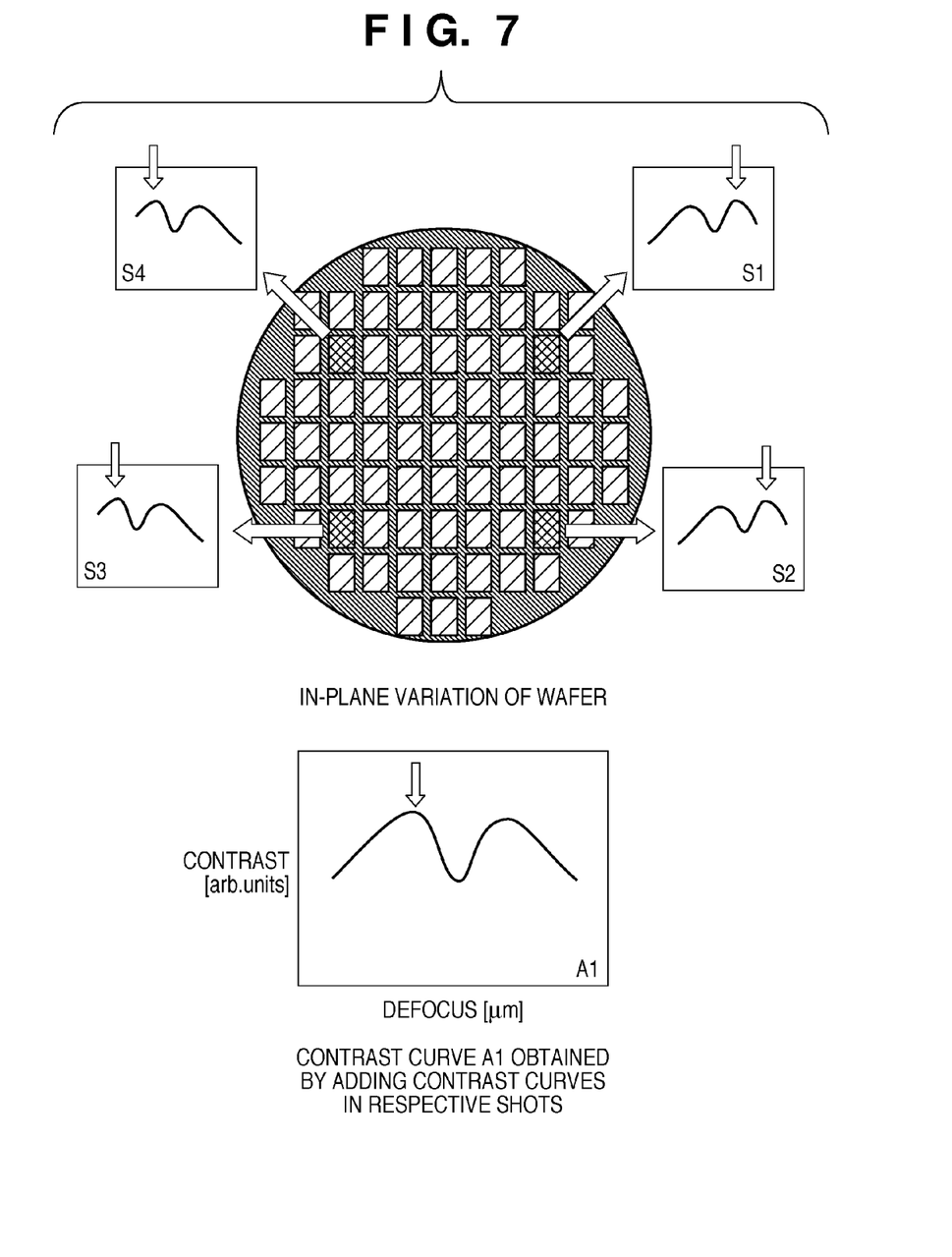
FIG. 7 is a view showing an example of the overview of a focus position detection method according to the third embodiment.

If a plurality of peaks is detected, the control unit 8 acquires the contrast curves in respective shots on the surface of the wafer W in order to detect the focus position of the alignment detection system OA (S1 to S4 in FIG. 7).

The contrast curves in respective shots shown in FIG. 7 differ due to in-plane process variations on the surface of the wafer W, so the peak positions of the contrast change for each shot. The control unit 8 adds all these contrast curves and averages them, thereby calculating a contrast curve A1. A focus position which exhibits the maximum value of the contrast curve A1 is calculated. In the contrast curves in respective shots (S1 to S4 in FIG. 7), peaks close to the peak of the contrast curve A1 are determined as the focus positions.

In each of the contrast curves S1 and S2, the right peak is higher than the left peak. However, the left peak is selected as the focus position to match a peak position which exhibits the maximum value of the contrast curve A1.

Although FIG. 7 exemplifies a case in which the contrast curves S1 to S4 at four points are added, the number of points need not always be four, and may be, for example, two or five. As the number of contrast curves to add increases, a more stable contrast curve A1 can be obtained by the average effect.

As described above, according to the third embodiment, it is possible to perform alignment at a focus position obtained by taking account of a variation for each shot on the wafer W even when there is an in-plane process variation on the surface of the wafer W.

Fourth Embodiment

A focus position detection method according to the fourth embodiment will be explained next. As in the first embodiment, the fourth embodiment will exemplify a case in which a peak close to a reference focus position is selected from a plurality of peaks, thereby detecting the focus position. The difference from the first embodiment lies in that the position designated in accordance with an instruction (issued via an input device (for example, an operation panel OP shown in FIG. 1)) by, for example, the operator is adopted as the reference focus position in the fourth embodiment.

To obtain an optimum focus position for an alignment detection system OA, a control unit 8 measures the contrast curve under an arbitrary illumination condition, and obtains the number of peaks of this curve, in the same way as described in the first embodiment.

If the contrast curve has a plurality of peaks, a peak close to an arbitrary focus position designated via the operation panel OP by, for example, the operator is determined as the focus position of the alignment mark measured.

As described above, according to the fourth embodiment, it is possible to detect a stable focus position even when there is a process variation between shots, between wafers, or between lots. This allows alignment measurement with high accuracy.

A combination of the above-mentioned first to third embodiments and the fourth embodiment may be practiced. For example, if alignment cannot be performed at a stable focus position even by the methods described in the first to third embodiments, the operator may input an arbitrary focus position so that a contrast peak close to the input focus position is adopted as the focus position used.

Fifth Embodiment

A focus position detection method according to the fifth embodiment will be explained next. The fifth embodiment will exemplify a case in which the focus position is fixed if there is a plurality of peaks and its variation is large or the methods described in the first to fourth embodiments cannot cope with the circumstances involved.

To obtain an optimum focus position for an alignment detection system OA, a control unit 8 measures the contrast curve under an arbitrary illumination condition, and obtains the number of peaks of this curve, in the same way as described in the first embodiment.

If there is a plurality of peaks and its variation is large or the methods described in the first to fourth embodiments cannot cope with the circumstances involved, the control unit 8 fixes the focus position.

Indices for fixing the focus position include:

1. the focus position in the reference illumination mode is determined as the fixed focus position;

2. the focus position for an immediately preceding shot or a shot on an immediately preceding wafer is determined as the fixed focus position;

3. the relationships between the driving amounts of a wafer W in the z direction in all measurement shots and the signals output from an image sensor 28 are averaged, and a peak position which exhibits the maximum value of the average contrast curve is determined as the fixed focus position; and 4. an arbitrary position is input via an input device by, for example, the operator, and the input position is determined as the fixed focus position.

That is, the focus position is fixed based on the indices in "1", "2", "3", and "4", that is, the first to fourth embodiments, respectively.

When the index in "4" mentioned above is used, the focus position to be detected is not a relative position such as "the position at which the contrast is high" as has been described above. For this reason, the focus position is measured and determined using an optical focus detection system, which measures the focus position of a target object, such as a focus position detection system FS of the oblique-incidence detection scheme shown in FIG. 1.

Sixth Embodiment

A focus position detection method according to the sixth embodiment will be explained next. The sixth embodiment will exemplify a case in which the focus position is detected by combining the above-mentioned first to fifth embodiments.

Figure 8:
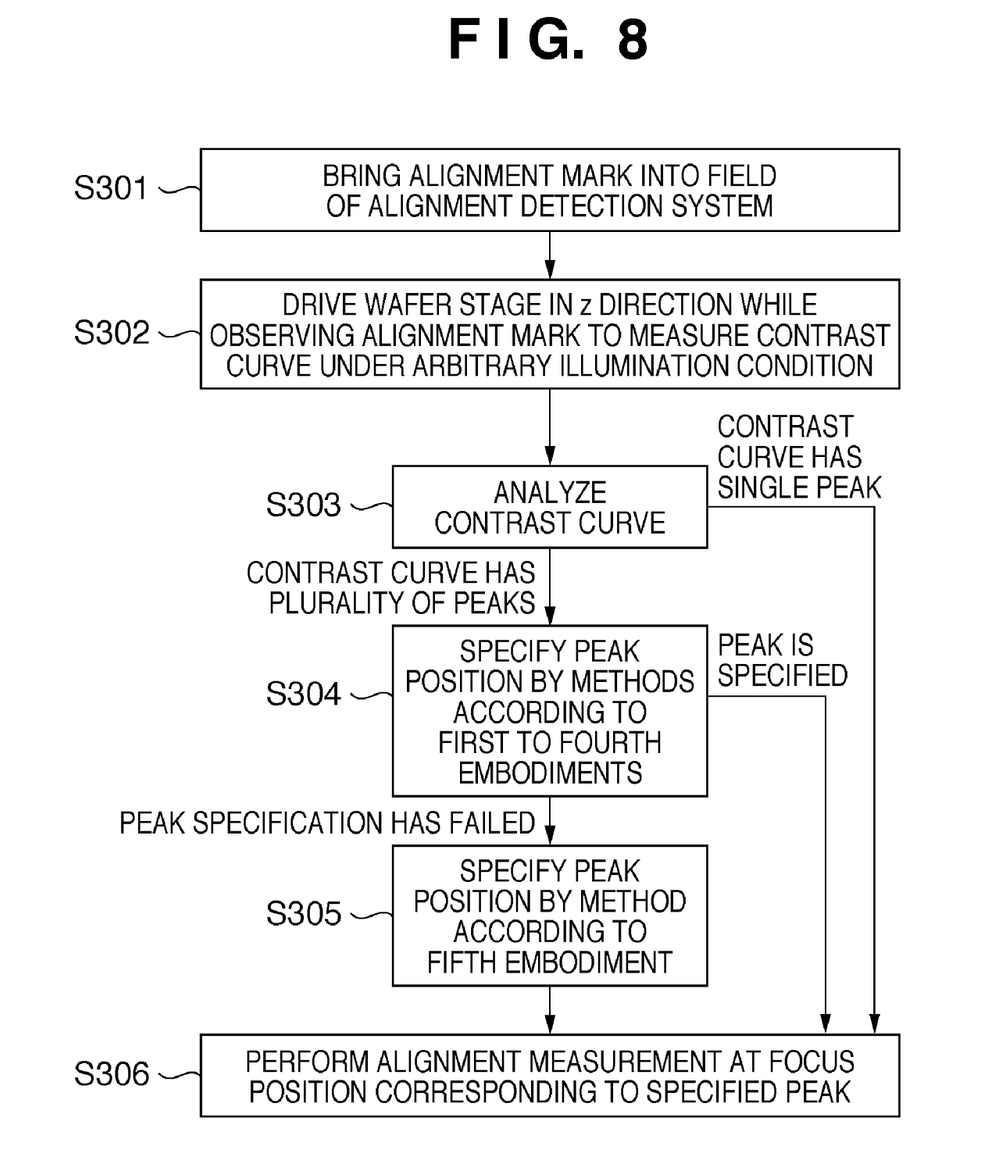
FIG. 8 is a flowchart illustrating an example of the sequence of a focus position detection method according to the sixth embodiment.

An example of the sequence of the focus detection method according to the sixth embodiment will be explained with reference to FIG. 8 herein.

A control unit 8 controls a stage driving mechanism (not shown) to drive a wafer stage WS so that an alignment mark M on a wafer W falls within the field of an alignment detection system OA (step S301). As the alignment mark M is brought into the field of the alignment detection system OA, the control unit 8 controls the stage driving mechanism to drive the wafer stage WS in the z direction while observing the alignment mark M. The control unit 8 then obtains the relationship between the driving amount of the wafer W in the z direction and the contrast of the signal output from an image sensor 28 based on the illumination of the alignment mark M, thereby measuring the contrast curve (step S302).

The control unit 8 calculates the number of peaks by differentiation or polynomial fitting, as described in the first embodiment, in order to analyze whether the contrast curve has a plurality of convex peaks (step S303).

If the contrast curve has a single peak, a focus position which exhibits that peak is an optimum focus position for alignment, and alignment is performed at that focus position. If the contrast curve has a plurality of peaks, the relative level of each peak may change due to process variations and therefore a peak which exhibits an optimum focus position may change for each shot. To cope with this situation, the control unit 8 selects a peak so that a peak around a specific position is always detected as the focus position irrespective of a change in the relative level, using the methods described in the first to fourth embodiments (step S304).

If the control unit 8 has failed the peak selection in step S304, it fixes the focus position in alignment detection, using the method according to the fifth embodiment (step S305). The control unit 8 fixes the focus position in alignment detection, using the method according to the fifth embodiment as well, if a process variation is so large that the methods described in the first to fourth embodiments are insufficient to prevent a variation in the focus position, which translates into a shift variation, resulting in degradation in the alignment accuracy. Alignment is performed at this fixed focus position (step S306).

As described above, according to the sixth embodiment, it is possible to perform alignment at a stable focus position at which the contrast is high even when the detection of the focus position by the methods described in the first to fifth embodiments has failed.

Although exemplary embodiments of the present invention have been explained above, the present invention is not particularly limited to the embodiments shown in the drawings described above, and can be practiced by appropriately modifying the embodiments without departing from the spirit and scope of the present invention.

For example, the above-mentioned embodiments have exemplified a case in which an index of detecting the focus position of the alignment mark M in the alignment detection system OA is the contrast. However, the light amount, the symmetry or shape of the detection waveform, or the like may be used as long as that index is an evaluation index for the signal output from the image sensor 28. Even in this case, the problems involved can be solved by the same method as above even when a plurality of focus position candidates has been detected.

Also, although the above-mentioned embodiments have exemplified a case in which the focus position in the alignment detection system OA is detected, the detection of the focus position as above is also applicable to detectors other than the alignment detection system OA. For example, the detection of the focus position as above may be applied to optical position detection units which detect the position of a target object using illumination light (for example, the optical position detection system CA of the TTL-AA scheme and the reticle alignment optical system RA).

A device is manufactured by a step of exposing a substrate (for example, a wafer or glass plate) coated with a photoresist (photosensitive agent) to light using an exposure apparatus, a step of developing the exposed substrate, and other known steps.

According to the present invention, a variation in the focus position is suppressed even when a plurality of peaks is detected in the evaluation value of the signal output from an image sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-031029 filed on Feb. 12, 2008, which is hereby incorporated by reference herein in its entirety.

What is claimed is:

1. A position detection method for detecting a focus position of an optical position detection apparatus including an image sensor and an optical system which forms an image of a target object on an image sensing surface of the image sensor, the method comprising:

measuring a relationship between a position of the target object in a focus direction of the optical system and an evaluation value of the signal output from the image sensor; and detecting, as the focus position, a position of a peak close to a reference focus position, which is selected if the evaluation value has a plurality of peaks in the relationship measured in the measuring.

2. The method according to claim 1, wherein in the detecting, the reference focus position is detected as the focus position if the selection of a peak close to the reference focus position has failed.

3. The method according to claim 1, wherein the reference focus position is a position of a peak of an evaluation value of the signal output from the image sensor when the target object is illuminated under an illumination condition under which a single peak is generated in the evaluation value.

4. The method according to claim 3, wherein the detecting includes measuring the reference focus position if a plurality of peaks of the evaluation value are detected.

5. The method according to claim 1, wherein a position of a peak selected by using the relationship measured, in the measuring, for one of an immediately preceding shot region and an immediately preceding wafer is used as the reference focus position.

6. The method according to claim 1, wherein a position of a peak selected by using the result of averaging relationships measured, in the measuring, for a plurality of measurement shots is used as the reference focus position.

7. The method according to claim 1, wherein a position determined in accordance with an instruction issued via an input device by an operator is used as the reference focus position.

8. An exposure apparatus which projects a pattern of an original onto a substrate held by a stage, thereby exposing the substrate to light, the apparatus comprising:

an optical position detection unit which includes an image sensor and an optical system configured to form an image of a target object on an image sensing surface of said image sensor;

a stage driving mechanism configured to drive the stage; and a control unit configured to control said optical position detection unit and said stage driving mechanism, wherein said control unit measures a relationship between a position of the target object in a focus direction of said optical system and an evaluation value of the signal output from said image sensor, detects, as the focus position, a position of a peak close to a reference focus position, which is selected if the evaluation value has a plurality of peaks in the measured relationship, and aligns the stage by detecting the position of the target object at the focus position detected by said optical position detection unit and controlling said stage driving mechanism based on the position of the target object.

9. A device manufacturing method comprising:

exposing a substrate to light by an exposure apparatus; and developing the substrate, wherein the exposure apparatus includes an optical position detection unit which includes an image sensor and an optical system configured to form an image of a target object on an image sensing surface of the image sensor, a stage driving mechanism configured to drive the stage, and a control unit configured to control the optical position detection unit and the stage driving mechanism, and the control unit measures a relationship between a position of the target object in a focus direction of the optical system and an evaluation value of the signal output from the image sensor, detects, as the focus position, a position of a peak close to a reference focus position, which is selected if the evaluation value has a plurality of peaks in the measured relationship, and aligns the stage by detecting the position of the target object at the focus position detected by the optical position detection unit and controlling the stage driving mechanism based on the position of the target object.

* * * * *